US011022501B2

(12) United States Patent
Hsieh et al.

(10) Patent No.: US 11,022,501 B2
(45) Date of Patent: Jun. 1, 2021

(54) APPARATUS AND METHOD FOR MEASURING TEMPERATURE OF BATTERIES AND INTERNAL BATTERY COMPONENTS

(71) Applicant: Feasible, Inc., Berkeley, CA (US)

(72) Inventors: Andrew Gaheem Hsieh, Berkeley, CA (US); Barry James Van Tassell, El Cerrito, CA (US); Daniel Artemis Steingart, Princeton, NJ (US); Shaurjo Biswas, El Cerrito, CA (US); Robert Charles Mohr, Berkeley, CA (US)

(73) Assignee: Feasible, Inc., Berkeley, CA (US)

( * ) Notice: Subject to any disclaimer, the term of this patent is extended or adjusted under 35 U.S.C. 154(b) by 0 days.

(21) Appl. No.: 16/599,562

(22) Filed: Oct. 11, 2019

(65) Prior Publication Data

US 2020/0096398 A1 Mar. 26, 2020

Related U.S. Application Data

(63) Continuation of application No. 15/799,292, filed on Oct. 31, 2017, now Pat. No. 10,481,016.

(60) Provisional application No. 62/416,516, filed on Nov. 2, 2016.

(51) Int. Cl.
*G01N 27/416* (2006.01)
*G01K 11/24* (2006.01)
*G01R 31/382* (2019.01)
*H01M 10/48* (2006.01)

(52) U.S. Cl.
CPC ............ *G01K 11/24* (2013.01); *G01R 31/382* (2019.01); *H01M 10/486* (2013.01)

(58) Field of Classification Search
CPC .. G01R 31/36; G01R 31/3606; G01R 31/382; G01N 29/024; G01N 29/043; G01N 29/4427; G01N 29/4436; G01N 2291/02818; H01M 10/48; H01M 10/486; H01M 10/484; H01M 10/399; H01M 10/42; H01M 10/57; H01M 10/0525; H01M 2/0265
See application file for complete search history.

(56) References Cited

U.S. PATENT DOCUMENTS

| 10,014,561 | B2* | 7/2018 | Sood | B60L 3/12 |
| 2003/0036706 | A1* | 2/2003 | Slayton | A61B 8/0833 |
| | | | | 600/439 |
| 2011/0183168 | A1* | 7/2011 | Johnnie | G01F 23/296 |
| | | | | 429/93 |
| 2016/0084911 | A1* | 3/2016 | Mensah-Brown | G01N 29/04 |
| | | | | 318/139 |
| 2016/0223498 | A1* | 8/2016 | Steingart | G01N 29/46 |

* cited by examiner

*Primary Examiner* — Thang X Le
(74) *Attorney, Agent, or Firm* — Polsinelli PC

(57) ABSTRACT

Systems and methods for measuring temperature characteristics of a battery include one or more transducers coupled to the battery for transmitting and/or receiving sound waves through at least a portion of the battery. A temperature measurement unit is provided to determine a time-of-flight of sound waves through at least the portion of the battery based on transmitted and received sound waves through at least the portion of the battery, and to determine temperature characteristics of at least the portion of the battery based on the time-of-flight.

18 Claims, 3 Drawing Sheets

APPARATUS AND METHOD FOR MEASURING TEMPERATURE OF BATTERIES AND INTERNAL BATTERY COMPONENTS

CROSS-REFERENCE TO RELATED APPLICATIONS

The present application for patent claims the benefit of Provisional Patent Application No. 62/416,516 entitled "APPARATUS AND METHOD FOR MEASURING TEMPERATURE OF BATTERIES AND INTERNAL BATTERY COMPONENTS" filed Nov. 2, 2016, assigned to the assignee hereof and hereby expressly incorporated herein by reference in its entirety; and is a Continuation of patent application Ser. No. 15/799,292 entitled "APPARATUS AND METHOD FOR MEASURING TEMPERATURE OF BATTERIES AND INTERNAL BATTERY COMPONENTS," and assigned to the assignee hereof and hereby expressly incorporated herein by reference in its entirety.

STATEMENT REGARDING FEDERALLY SPONSORED RESEARCH OR DEVELOPMENT

This invention was made with U.S. Federal Government support under Grant No. SBIR 1621926 awarded by the National Science Foundation. The U.S. Federal Government has certain rights in the invention.

FIELD OF DISCLOSURE

Disclosed aspects are directed to battery diagnostics. More specifically, exemplary aspects are directed to measurement of temperature of batteries and internal components thereof.

BACKGROUND

Different types of battery implementations are known in the art, e.g., battery cells, battery packs, battery modules, etc. Furthermore, these various implementations may be available in different shapes such as cylindrical, pouch/prismatic, coin or button, etc., and moreover, the different batteries may also operate under different chemistries. However, a common feature among all batteries is that they store energy in the form of chemical and electrochemical reactions.

Thus, during operation of a battery (i.e., as the battery is charged or discharged), heat is produced within the battery wherein the reactions take place. If the battery is operated at low power (i.e., low currents), it is possible for a substantial portion of the heat that is generated to be conducted away, while at most a minor amount of heat may be accumulated. Heat accumulation in this manner may cause the temperature of the battery to only increase slightly, without significant effects on operation of the battery. On the other hand, if the battery is operated at a higher power, the heat may be generated more rapidly. In case the heat is generated more quickly than it can be conducted away or dissipated, the accumulation of heat can cause the temperature of the battery to increase to undesirable levels.

If the internal temperature of a battery becomes too high, the health and future performance of the battery can be negatively impacted. For example, due to high heat accumulation, organic electrolytes found in several types of batteries may decompose; polymer binders or membranes in batteries may melt; internal components of batteries may degrade; or other unwanted side reactions may take place. In extreme scenarios, catastrophic failure such as explosions or battery fires can also occur It is recognized that the temperature increase as noted above may not take place in a uniform manner across the body of the battery. Local inhomogeneities in the rate of electrochemical reactions can cause local temperature spikes, especially during high-rate, high-power operation. Internal short circuits may also cause local spikes in the temperature of the battery. These concerns are viewed as being increasingly important in view of the strong push towards designing batteries that can be safely charged and/or discharged at a fast rate.

In general, the temperature of a material or medium is related to the speed at which the constituent molecules making up the material or medium are vibrating. Thus, measuring the temperature of the material or medium is measured, may be effectively viewed as sampling the local vibrations at the measurement location. Conventionally, the temperature of a battery (typically during operation) is measured at a surface of the battery, using devices such as thermocouples, thermistors, resistance thermometers, silicon bandgap temperature sensors, thermal cameras, or fiber-optic gratings. A key deficiency associated with such methods is that heat is generated internally, e.g., at the electrodes where the electrochemical reactions take place, and thus the surface measurements may not be accurate. To explain further, in order to make these conventional measurements with state-of-the-art methods, the internally generated heat must first travel to the surface of the battery before the heat can be measured. Thus, surface measurements can lead to inaccuracies in both the spatial resolution and the temporal sensitivity of the temperature measurement. These drawbacks can be especially problematic if a device used for the temperature measurement is integrated into a control system or failure/fault warning system configured to detect and raise alarms or trigger corrective actions, for example, because the device would not be able to faithfully and correctly collect the requisite data.

Accordingly, there is a need recognized in the art for accurate temperature measurement techniques for batteries and internal components thereof.

SUMMARY

Exemplary aspects of this disclosure are directed to systems and methods for measuring temperature characteristics of a battery. One or more transducers are coupled to the battery for transmitting and/or receiving sound waves through at least a portion of the battery. A temperature measurement unit is provided to determine a time-of-flight of sound waves through at least the portion of the battery based on transmitted and received sound waves through at least the portion of the battery, and to determine temperature characteristics of at least the portion of the battery based on the time-of-flight.

For example, an exemplary aspect is directed to an apparatus comprising at least one transducer coupled to a battery, the at least one transducer configured to transmit and/or receive sound waves through at least a portion of the battery. A temperature measurement unit is configured to determine a time-of-flight of sound waves through at least the portion of the battery based on transmitted and received sound waves through at least the portion of the battery, and to determine temperature characteristics of at least the portion of the battery based on the time-of-flight.

Yet another exemplary aspect is directed to a method of determining temperature associated with a battery. The method comprises coupling at least one transducer to the battery, the at least one transducer configured to transmit and/or receive sound waves through at least a portion of the battery, determining a time-of-flight of sound waves through at least the portion of the battery based on transmitted and received sound waves through at least the portion of the battery, and determining temperature characteristics of at least the portion of the battery based on the time-of-flight.

Yet another exemplary aspect is directed to an apparatus comprising means for transmitting and/or receiving sound waves through at least a portion of a battery, means for determining a time-of-flight of sound waves through at least the portion of the battery based on transmitted and received sound waves through at least the portion of the battery, and means for determining temperature characteristics of at least the portion of the battery based on the time-of-flight.

BRIEF DESCRIPTION OF THE DRAWINGS

The accompanying drawings are presented to aid in the description of various aspects of the invention and are provided solely for illustration and not limitation.

DETAILED DESCRIPTION

Figure 1:
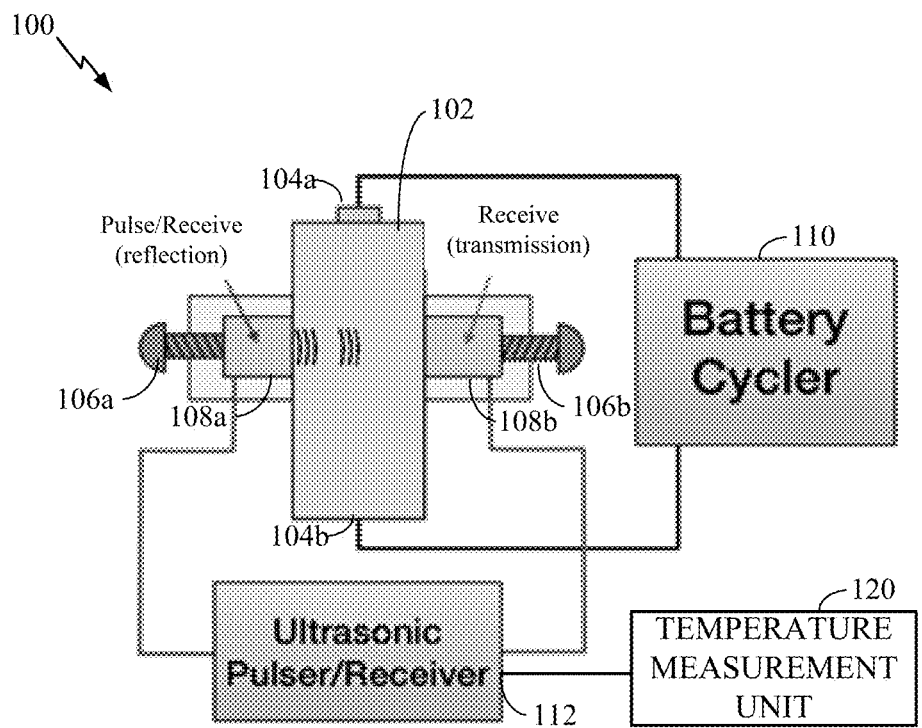
FIG. 1 is a schematic that illustrates example hardware for electrochemical-acoustic signal interrogation (EASI) testing.

Aspects of the invention are disclosed in the following description and related drawings directed to specific aspects of the invention. Alternate aspects may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any aspect described herein as "exemplary" is not necessarily to be construed as preferred or advantageous over other aspects. Likewise, the term "aspects of the invention" does not require that all aspects of the invention include the discussed feature, advantage or mode of operation.

The terminology used herein is for the purpose of describing particular aspects only and is not intended to be limiting of aspects of the invention. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Aspects of this disclosure are directed to accurate techniques for measuring the temperature of batteries, including the temperature of internal components within batteries, using acoustic signals. As molecular vibrations are fundamental to the propagation of sound, changes in temperature along the path of sound waves as they pass through a battery can be detected based on the resulting acoustic behavior of components of the battery. The temperature along the entire path of the sound does not need to change in order for the sound behavior to be affected; changes in the temperature of individual layers or components internal to the battery may be sufficient to affect the behavior of sound as it travels through the battery. Thus, the exemplary acoustic based approach to measuring temperature leads to improved efficiency and accuracy of measurement while overcoming the aforementioned drawbacks of existing techniques.

In general, it is recognized that the speed of sound traveling through the material goes down as the temperature of the material increases. Thus, in the case of a battery, even if internal layers or components thereof have different temperatures than their surroundings, analyzing the speed of sound through the various portions of the battery can reveal information regarding the temperature of the medium that the sounds waves are traveling through. In some aspects, different profiles for speeds of sounds may be created at different temperatures, e.g., during different points in the operation of a battery. For example, during various points in the charging/discharging cycles of the battery, the time-of-flight of sound waves or acoustic signals (or alternatively, pressure waves, stress waves, etc.) through the battery or specific portions thereof (e.g., pertaining to internal components to be analyzed or whose temperature measurements are desired) can be obtained. From these profiles, accurate temperature measurements may be retrieved for a battery or internal components thereof.

It will be understood that although reference is made to batteries under test or subject to analysis for temperature measurements using the exemplary systems and techniques, the term "battery" in this disclosure is used to convey any type of electrochemical energy storage device whose physical properties are to be analyzed using exemplary acoustic-signal based techniques. Thus, the term battery may convey a single battery cell or a combination (e.g., a string) of battery cells, a battery module, a battery pack, etc., without deviating from the scope of this disclosure.

With reference to FIG. 1, a schematic of system 100 configured according to an exemplary aspect of this disclosure is shown. System 100 comprises battery 102, to which a pair of transducers, e.g., first transducer 108a and second transducer 108b may be affixed on two locations (e.g., on opposite sides) on the surface of battery 102. In an aspect, transducers 108a-b may be acoustic transducers configured to convert variations in electrical voltage into mechanical pressure or mechanical actuation, or vice versa. Accordingly, at least one of transducers 108a-b (e.g., transducer 108a) may be an acoustic transducers configured to transmit acoustic signals through batteries or portions thereof. The transmitted acoustic signals or acoustic signals generated in response to the acoustic signals transmitted through the batteries or portions thereof may be received by the same or different acoustic transducer which transmitted the acoustic signals (e.g., by transducer 108a itself or by transducer 108b). However, in alternative aspects the response acoustic signals may also be received by other means for measuring vibrations such as accelerometers, optical or laser-based sensors, etc., even though these have not been explicitly illustrated, without departing from the scope of this disclosure. Accordingly, acoustic transducers (or simply, transducers such as transducers 108a-b), possibly in conjunction with other means for sensing vibrations (e.g., accelerometers) may be used in temperature measurement of battery 102 as will be further explained below.

With continued reference to FIG. 1, hardware such as screws 106a-b are shown, but other alternative means for affixing transducers 108a-b to the body of battery 102 may be used. Battery cycler 110 represents a controller for charging-discharging battery 102 (e.g., any means for placing battery 102 in charge or discharge cycles) and may be connected to battery 102 through terminals 104a-b of battery 102. Ultrasonic pulser/receiver 112 is an example acoustic pulser and receiver coupled to transducers 108a-b, wherein through the control of one of ultrasonic pulser/receiver 112, one of transducers 108a-b is configured to transmit acoustic signals such as ultrasonic signals (also referred to as an acoustic pulse) while the other one of transducers 108a-b is configured to receive a response acoustic signal based on the transmitted acoustic or ultrasonic signals (wherein, it will be understood that the ultrasonic signals is only one example of acoustic signals which may be used for temperature measurement of battery 102 in this disclosure, while any other acoustic signal may also be employed instead of ultrasonic signals without deviating from the scope of this disclosure).

Temperature measurement unit 120 is shown to be coupled to ultrasonic pulser/receiver 112 to illustrate one example implementation aspect. Temperature measurement unit 120 may include a processor or computer, wherein temperature measurement unit 120 may be configured to receive information on acoustic (e.g., ultrasonic) signals transmitted and received from at least portions of battery 102, analyze the transmitted and received acoustic signals to determine information such as time-of-flight through the portions of battery 102 which were exposed to the acoustic signals and based on such information, determine temperature characteristics of battery 102 and internal components thereof.

In more detail, the measurement of temperature with sound, such as the ultrasonic signals, may be achieved by generating a pulse of the sound from a sound source such as one of acoustic transducers 108a-b. Although two transducers 108a-b have been shown in FIG. 1, it is not necessary to have separate transducers or even limit the number of transducers to two. As such, one or more transducers may generally be employed in the measurement of temperature of battery 102 according to aspects of this disclosure. For example, in FIG. 1, transducer 108a can be used to transmit sound waves (e.g., ultrasonic signals) through battery 102 or portions thereof, and a different transducer such as transducer 108b may be configured as a receiver to detect the resulting behavior of sound after it travels through at least a portion of the battery (wherein the transducer receiving the resulting sound may be referred to as being configured in a "transmission" or "through" mode). As previously mentioned, another type of sensor, such as an accelerometer, may be used in place of transducer 108b in order to measure the resulting behavior of sound after it travels through at least the portion of the battery.

In another instance, transducer 108a may be used to transmit sound waves (e.g., ultrasonic signals) through battery 102 or portions thereof, and the same transducer 108a may be configured as a receiver to detect the resulting behavior of sound after it travels through at least a portion of the battery (wherein the transducer sending the initial sound and receiving the resulting sound may be referred to as being configured in a "pulse/echo" or "reflection" mode).

The resulting sound signal data can be stored on the computer, e.g., disposed in temperature measurement unit 120, as noted above. The computer need not be local to system 100 but may be remote or in some implementations, the data pertaining to the resulting sound signal can be transferred to a remote server from a local computer.

The resulting sound signal data can be analyzed with physical models and/or computer algorithms that are trained to decouple features in the sound signal that are related to the temperature of the battery or internal components, and other physical properties of the battery or internal components such as density, modulus, electrolyte viscosity, layer thickness, etc. In one aspect, techniques such as cross-correlation correction, non-linear adjustment of received signals, etc., may be used in analyzing the effects of temperature on the sounds signals. For example, based on the time-of-flight of a baseline sound signal at a known or initial temperature, compared with the time-of-flight of another received sound signal resulting from transmitting an ultrasonic pulse through at least a portion of battery 102 may be used to infer temperature characteristics of the portions of battery 102 exposed to the sound signals.

Figure 2:
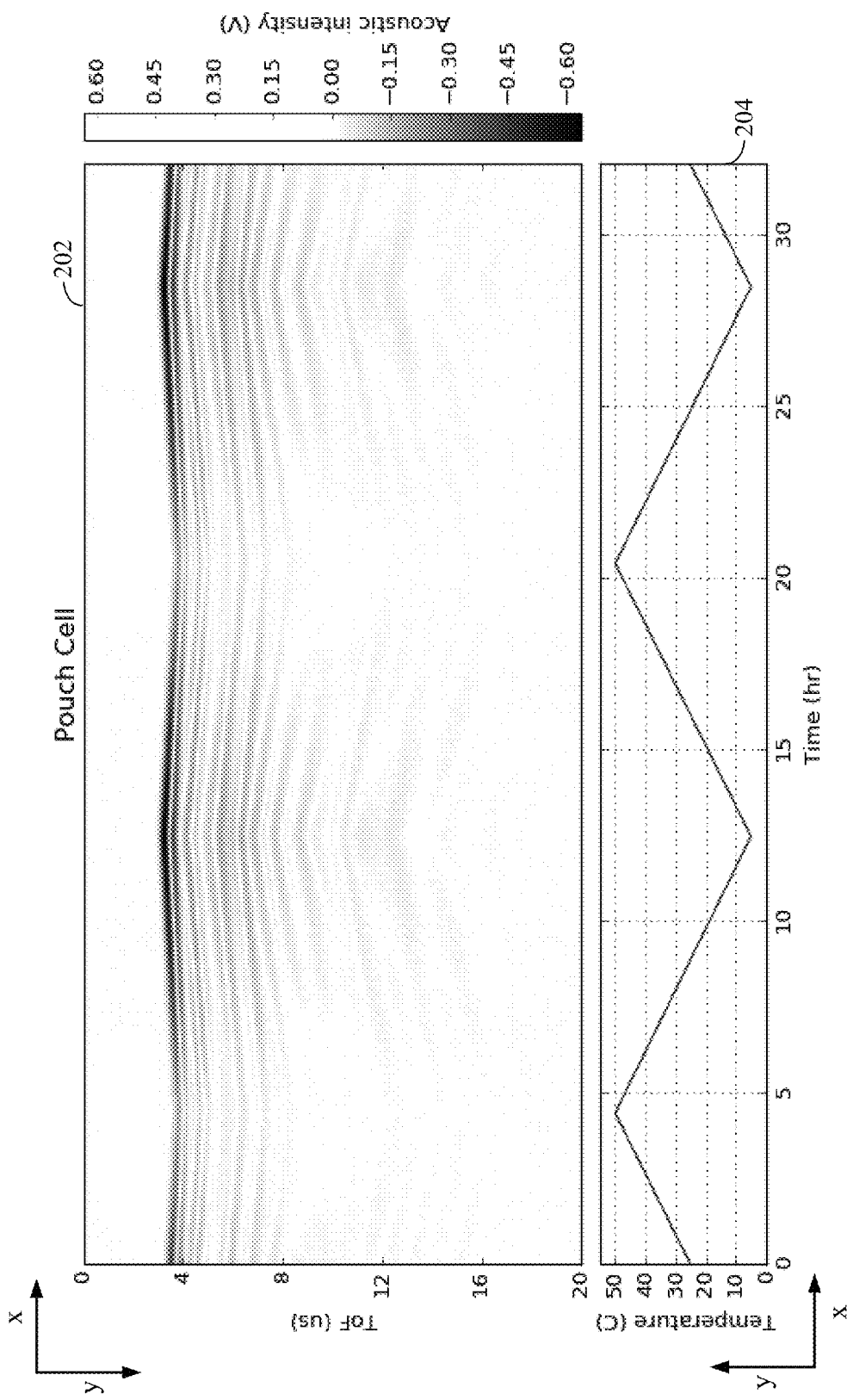
FIG. 2 illustrates a graphical representation of time-of-flight variations with temperature changes in a battery, according to exemplary aspects of this disclosure.

For example, FIG. 2 illustrates time-of-flight variation for battery 102 (e.g., wherein battery 102 is a pouch cell) with temperature changes. As can be observed, plot 202 shows the time-of-flight (ToF in microseconds) of sound waves through battery 102 or any portion thereof, measured using transducers 108a-b, for example on the y-axis, with respective time period or timeline of observation plotted on the x-axis. Since ToF may also vary with acoustic signal intensity, various acoustic signal intensities are representatively shown with darkness of shading in plot 202 so that the ToF information may be correlated to the intensity of acoustic signals transmitted and measured in specific implementations of transducers 108a-b, for example.

Plot 204 shows the same timeline as plot 202 on the x-axis with corresponding temperature variation of battery 104 shown on the y-axis. Thus, at any point in time, temperature from plot 204 may be correlated with ToF of the sound waves (for a corresponding acoustic signal intensity) in plot 202. Accordingly, based on the observed ToF, temperature of battery 102 or any corresponding portion thereof through which the ToF measurement was taken, may be estimated. For example, baseline plots 202 and 204 may be established for a known battery or portions thereof under test; and subsequently for the same battery or a different battery or respective portions thereof, based on observed ToFs at a given intensity, plot 202 may be generated and corresponding temperature may be obtained from plot 204. In an aspect, temperature measurement unit 120 may be configured to store plots 202 and 204 (e.g., in any suitable memory or storage mechanism) and lookup (e.g., using any suitable logic, software, hardware, or combinations thereof) temperature corresponding to any measured ToF using transducers 108a-b from these stored plots 202, 204. In this manner, precise measurement of temperature of battery 102 or specific components or portions thereof may be calculated. Furthermore, deviations from expected temperature characteristics may also be used as indications of defects or failures in the battery or portions thereof.

In another example, time-of-flight of a pressure-wave or shear-wave traveling through battery 102 or portions thereof may also be used in similar analyses to infer temperature information. Although for pressure-waves and shear-waves, different transducers than those used in acoustic measurements discussed above, may be used, the configuration of system 100, would be similar to the above description without significant deviation from the scope of this disclosure.

In exemplary aspects, the measurement of temperature using pulses of sound can be carried out while battery 102 is not in operation (i.e., active charge/discharge cycles). Alternatively, the exemplary temperature measurement may be performed while battery 102 is taken through charge/discharge cycles by battery cycler 110, for example. Information pertaining to the temperature of the internal components being studied during charge/discharge cycles can reveal useful information pertaining to temperature variation across different portions of the battery during charging/discharging.

Such a sound-based temperature measurement apparatus, e.g., temperature measurement unit 120, can be integrated into a battery management or monitoring system. This enables information about the temperature of the battery or internal battery components to be used as an input for active control over battery operation to optimize performance and also to detect signatures of catastrophic failure. If any unwanted side reactions occur during operation or storage, such as the formation of internal shorts or decomposition of electrolyte, the heat generation and associated change in internal temperature may be detected with the acoustic apparatus well in advance of the current state-of-the-art methods that measure temperature at the surface of the battery.

Further, the exemplary sound-based temperature measurement system may also be deployed in production lines for manufacturing batteries or components thereof. For instance, the exemplary analyses may reveal any undesired variations or fluctuations which may take place due to temperature variations during the production cycle. These analyses may be performed in a relatively high speed manner to enable a high-throughput measurement of temperature.

Figure 3:
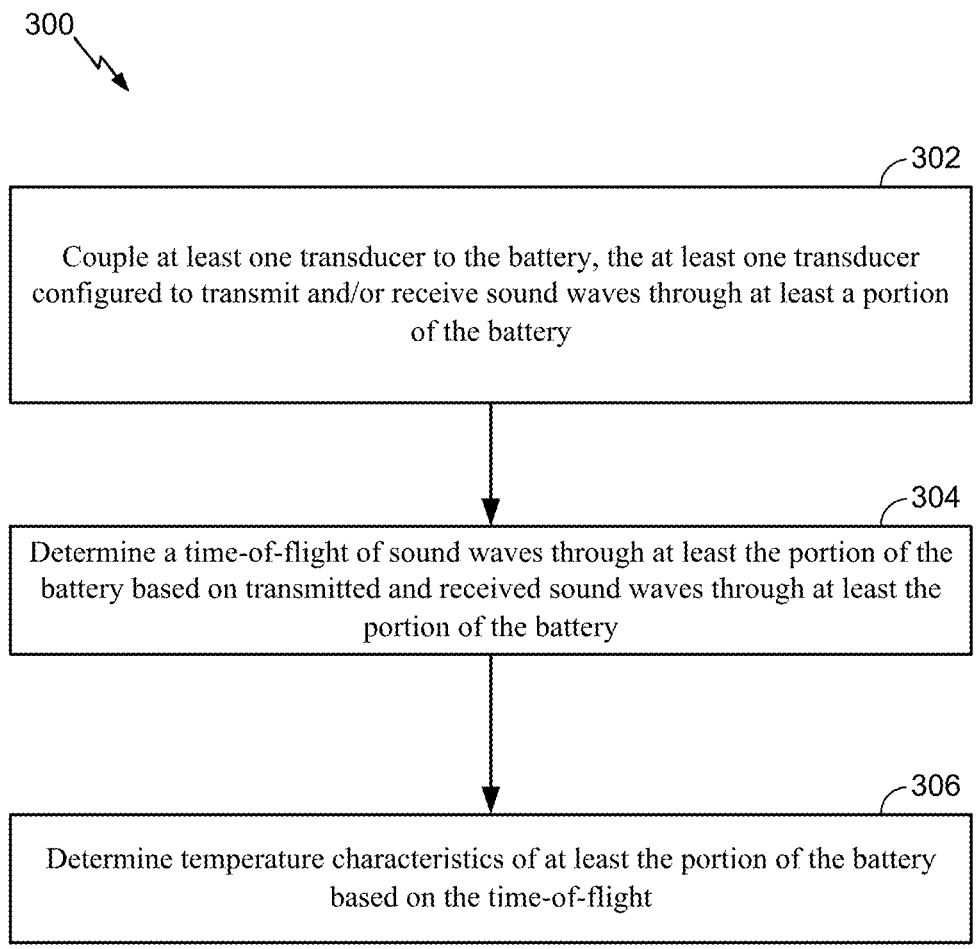
FIG. 3 illustrates a method of determining temperature associated with a battery, according to example aspects of this disclosure.

It will be appreciated that aspects include various methods for performing the processes, functions and/or algorithms disclosed herein. For example, FIG. 3 illustrates an exemplary method 300 of determining temperature associated with a battery (e.g., battery 102 of FIG. 1).

Block 302 comprises coupling at least one transducer to the battery, the at least one transducer configured to transmit and/or receive sound waves through at least a portion of the battery (e.g., wherein the at least one transducer is one of a transmitter or receiver of acoustic signals, such as transducers 108a-b, wherein the receiver may be a sensor for receiving response signals or for sensing vibrations, such as an accelerometer). In some aspects, the battery may be placed in charge or discharge cycles during the above measurements of temperature characteristics (e.g., by means of battery cycler 110).

Block 304 comprises determining a time-of-flight of sound waves through at least the portion of the battery based on transmitted and received sound waves through at least the portion of the battery (e.g., in temperature measurement unit 120, based on analyzing transmitted and received signals from ultrasonic pulser/receiver 112).

Block 306 comprises determining temperature characteristics of at least the portion of the battery based on the time-of-flight (e.g., based on plots 202, 204 of FIG. 2 discussed above and suitable mechanisms provided in temperature measurement unit 120). In some aspects, determining the temperature characteristics may further include detecting indications of failure (e.g., by means of plots 202, 204 and the and corresponding logic in temperature measurement unit 120), such as one or more of unwanted side reactions during operation or storage of the battery, formation of short circuits within the battery, or decomposition of an electrolyte of the battery.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Accordingly, an aspect of the invention can include a computer-readable media embodying a method for measurement of temperature of batteries and internal components thereof. Accordingly, the invention is not limited to illustrated examples and any means for performing the functionality described herein are included in aspects of the invention.

While the foregoing disclosure shows illustrative aspects of the invention, it should be noted that various changes and modifications could be made herein without departing from the scope of the invention as defined by the appended claims. The functions, steps and/or actions of the method claims in accordance with the aspects of the invention described herein need not be performed in any particular order. Furthermore, although elements of the invention may be described or claimed in the singular, the plural is contemplated unless limitation to the singular is explicitly stated.

What is claimed is:

1. A method of temperature measurement, the method comprising:
    transmitting one or more test input acoustic signals into at least a portion of a test battery;
    detecting one or more test response signals generated in response to the one or more input acoustic signals;
    forming a test data set comprising the one or more test input acoustic signals and the one or more test response signals for the test battery;
    comparing the test data set with a reference data set, the reference data set comprising one or more reference input acoustic signals and one or more reference response signals for a reference battery; and
    determining one or more temperature characteristics of the test battery based on the comparison.

2. The method of claim 1, wherein:
    the test data set further comprises one or more test time-of-flight values for the one or more test input acoustic signals travelling through at least the portion of the test battery,
    the reference data set further comprises one or more reference time-of-flight values for the one or more reference input acoustic signals travelling through at least a portion of the reference battery, and wherein comparing the test data set with the reference data set further comprises comparing the one or more test time-of-flight values with the one or more reference time-of-flight values.

3. The method of claim 2, wherein the test time-of-flight values are based on the one or more temperature characteristics of at least the portion of the test battery, and the reference time-of-flight values are based on one or more temperature characteristics of at least the portion of the reference battery.

4. The method of claim 2, wherein the test time-of-flight values are based on test signal intensities of the one or more test input acoustic signals, the reference time-of-flight values are based on reference signal intensities of the one or more reference input acoustic signals, and wherein comparing the one or more test time-of-flight values with the one or more reference time-of-flight values comprises comparing the one or more test time-of-flight values correlated to their respective test signal intensities with the one or more reference time-of-flight values correlated to their respective reference signal intensities.

5. The method of claim 1, wherein the test battery is the reference battery, with the test data set and the reference data set having different temperature characteristics.

6. The method of claim 1, wherein the test battery is different from the reference battery.

7. An apparatus for temperature measurement, the apparatus comprising:

a memory; and a processor implemented in circuitry, and configured to:

form a test data set comprising the one or more test input acoustic signals and one or more test response signals for a test battery, the one or more test input acoustic signals transmitted into at least a portion of a test battery, and the one or more test response signals generated in response to the one or more input acoustic signals;

obtain a reference data set comprising one or more reference input acoustic signals and one or more reference response signals for a reference battery;

compare the test data set with the reference data set; and determine one or more temperature characteristics of the test battery based on the comparison.

8. The apparatus of claim 7, wherein:

the test data set further comprises one or more test time-of-flight values for the one or more test input acoustic signals travelling through at least the portion of the test battery, the reference data set further comprises one or more reference time-of-flight values for the one or more reference input acoustic signals travelling through at least a portion of the reference battery, and wherein comparing the test data set with the reference data set further comprises comparing the one or more test time-of-flight values with the one or more reference time-of-flight values.

9. The apparatus of claim 8, wherein the test time-of-flight values are based on the one or more temperature characteristics of at least the portion of the test battery, and the reference time-of-flight values are based on one or more temperature characteristics of at least the portion of the reference battery.

10. The apparatus of claim 8, wherein the test time-of-flight values are based on test signal intensities of the one or more test input acoustic signals, the reference time-of-flight values are based on reference signal intensities of the one or more reference input acoustic signals, and wherein comparing the one or more test time-of-flight values with the one or more reference time-of-flight values comprises comparing the one or more test time-of-flight values correlated to their respective test signal intensities with the one or more reference time-of-flight values correlated to their respective reference signal intensities.

11. The apparatus of claim 7, wherein the test battery is the reference battery, with the test data set and the reference data set having different temperature characteristics.

12. The apparatus of claim 7, wherein the test battery is different from the reference battery.

13. A non-transitory computer-readable medium having stored thereon instructions that, when executed by one or more processors, cause the one or more processors to:

form a test data set comprising the one or more test input acoustic signals and one or more test response signals for a test battery, the one or more test input acoustic signals transmitted into at least a portion of a test battery, and the one or more test response signals generated in response to the one or more input acoustic signals;

obtain a reference data set comprising one or more reference input acoustic signals and one or more reference response signals for a reference battery compare the test data set with the reference data set; and determine one or more temperature characteristics of the test battery based on the comparison.

14. The non-transitory computer-readable medium of claim 13, wherein:

the test data set further comprises one or more test time-of-flight values for the one or more test input acoustic signals travelling through at least the portion of the test battery, the reference data set further comprises one or more reference time-of-flight values for the one or more reference input acoustic signals travelling through at least a portion of the reference battery, and wherein comparing the test data set with the reference data set further comprises comparing the one or more test time-of-flight values with the one or more reference time-of-flight values.

15. The non-transitory computer-readable medium of claim 14, wherein the test time-of-flight values are based on the one or more temperature characteristics of at least the portion of the test battery, and the reference time-of-flight values are based on one or more temperature characteristics of at least the portion of the reference battery.

16. The non-transitory computer-readable medium of claim 14, wherein the test time-of-flight values are based on test signal intensities of the one or more test input acoustic signals, the reference time-of-flight values are based on reference signal intensities of the one or more reference input acoustic signals, and wherein comparing the one or more test time-of-flight values with the one or more reference time-of-flight values comprises comparing the one or more test time-of-flight values correlated to their respective test signal intensities with the one or more reference time-of-flight values correlated to their respective reference signal intensities.

17. The non-transitory computer-readable medium of claim 13, wherein the test battery is the reference battery, with the test data set and the reference data set having different temperature characteristics.

18. The non-transitory computer-readable medium of claim 13, wherein the test battery is different from the reference battery.

\* \* \* \* \*